United States Patent
Hsu et al.

(10) Patent No.: US 7,683,381 B2
(45) Date of Patent: Mar. 23, 2010

(54) SEMICONDUCTOR LIGHT-EMITTING DEVICE

(75) Inventors: Chih Peng Hsu, Tainan County (TW); Chih Pang Ma, Taoyuan County (TW); Shih Hsiung Chan, Hsinchu County (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 70 days.

(21) Appl. No.: 12/031,473

(22) Filed: Feb. 14, 2008

(65) Prior Publication Data

US 2008/0246047 A1 Oct. 9, 2008

(30) Foreign Application Priority Data

Apr. 3, 2007 (TW) .............................. 96111739 A

(51) Int. Cl.
*H01L 29/267* (2006.01)

(52) U.S. Cl. .............................. 257/81; 257/91; 257/99; 257/E33.068

(58) Field of Classification Search .................. 257/13, 257/79–103, 918, 98, E33.068
See application file for complete search history.

(56) References Cited

U.S. PATENT DOCUMENTS

2008/0210959 A1* 9/2008 Nagai et al. .................... 257/94

* cited by examiner

*Primary Examiner*—Evan Pert
*Assistant Examiner*—Scott R Wilson

(57) ABSTRACT

A semiconductor light-emitting device comprises an N-type semiconductor layer, an active layer formed on the surface of the N-type semiconductor layer, a P-type semiconductor layer formed on the surface of the active layer, and a reflective layer formed on the surface of the P-type semiconductor layer. A plurality of ohmic contact blocks with electrical properties of ohmic contact are on the surface of the reflective layer adjacent to the P-type semiconductor layer, and the remaining part of the surface acts as the reflective regions with higher reflectivity, and the reflective regions can effectively reflect the light generated from the active layer.

19 Claims, 5 Drawing Sheets

SEMICONDUCTOR LIGHT-EMITTING DEVICE

BACKGROUND OF THE INVENTION (A) Field of the Invention

The present invention relates to a semiconductor light-emitting device, and more particularly, to a photo-electronic semiconductor device comprising P-type ohmic contacts and reflective structures.

(B) Description of the Related Art

Light-emitting diodes (LED) have been widely used in various products and have recently become an important research topic in photo-electronic semiconductor materials for producing blue light LED. Materials currently used for blue light LED include ZnSe, SiC, and InGaN etc., and those semiconductor materials exhibit band gap properties with the gap energy of approximately over 2.6 eV.

As the GaN series of light-emitting materials exhibits direct gap properties, they are able to generate light with high luminance and have the advantage of longer lifetime compared to the other similar direct gap material, ZnSe. Furthermore, the range of the gap energy of the GaN series or other III-V nitrides is between 1.9 eV and 6.2 eV, and the generated light mostly covers the band of the entire visible light and ultraviolet light spectrum. The GaN material differs from other III-V nitrides with cubic structure, wherein the crystal of GaN forms a stable hexahedron structure.

FIG. 1 is the cross section diagram of a conventional light-emitting diode 10 with the GaN semiconductor layer. An N-type semiconductor layer 12, an active layer 13, a P-type semiconductor layer 14, an ohmic contact layer 15, and a reflective layer 16 are sequentially formed on the sapphire substrate 11, and an N-type electrode 17 is formed on the exposed surface of the N-type semiconductor layer 12. The materials commonly used for P-type semiconductor layer 14 with good ohmic contact, such as nickel/gold or gold, are often poor in light reflectivity, especially for light with shorter wavelengths such as blue light, violet light, and ultraviolet light. Furthermore, most transparent conductive materials also absorb or block the light with shorter wavelengths, for example, ITO. If materials with better light reflectivity are used as the ohmic contact layer 15, for example, rhodium (Rh), palladium (Pd), and platinum (PT), although properties of good ohmic contact and fine reflectivity can both be achieved, they are mostly expensive and rare metals. Furthermore, the deposition process for the rare metals is difficult and does not result in good surface yields under general conditions of mass production, which significantly diminishes the reflective effect of light.

Generally, the resistance of the metal reflective layer 16 is far lower than that of the N-type semiconductor layer 12, and therefore, the resistance of the reflective layer 16 can be ignored and the reflective layer 16 can be considered as an equipotential level. Accordingly, the resistance of the N-type semiconductor layer 12 results in a potential gradient for the light-emitting structure in the light-emitting diode 10, where the potential distribution in the N-type semiconductor layer 12 is inversely proportional to the distance to the N-type electrode 17. As shown in FIG. 2, the horizontal distances from point O on the N-type electrode 17 to points A, B, and C on the reflective layer 16 in FIG. 1 are respectively from small to large, and therefore, the accumulative resistance of the N-type semiconductor layer 12 results in three cross-voltages $\Delta V$s between points A, B, and C with respect to point O from high to low. The passing current I and cross-voltage $\Delta V$ have a proportional relationship according to Ohm's law; therefore, the current passing through the light-emitting structure is non-uniformly distributed. There also is a difference in luminance that indirectly affects the efficiency and reliability of the active layer 13.

FIG. 3 is the cross-sectional diagram of another conventional light-emitting diode 30 with a GaN semiconductor layer. A dielectric layer 38 with the thickness of a quarter of a wavelength is formed on the surface of the P-type semiconductor layer 34 in the light-emitting diode 30, and a plurality of vias is formed on the dielectric layer 38. The plurality of vias is filled with metal and thereby a plurality of ohmic contacts 39 is formed. A reflective layer 36 is stacked on the dielectric layer 38, and since the reflective layer 36 typically uses gold or nickel/gold materials with poor reflectivity, the light utilization cannot be effectively improved. The thickness of the dielectric layer 38 requires good process control, namely a high-precision optical process and the related equipment, to result in an even film thickness, otherwise the original light or reflected light is not able to pass through the dielectric layer 38. Furthermore, the highly precise required process of opening micro-vias in the thick dielectric layer 38 and filling the vias with metal cannot be achieved in cost-effective mass production.

The prior art described above exhibits the disadvantages of poor light utilization, high costs, and non-uniform current distribution which cause a limited or insufficient light-emitting area.

In summary, the current market needs a semiconductor light-emitting device that can ensure low cost, stable quality, and ease of implementation to eliminate all the drawbacks of the prior art described above.

SUMMARY OF THE INVENTION

One aspect of the present invention is to provide a semiconductor light-emitting device with both high reflectivity and good ohmic contacts, and by disposing a material with good ohmic contact on the upper surface of the reflective layer with good reflectivity, the light utilization is enhanced and the resistance for the current between the reflective layer and the P-type semiconductor layer is reduced.

Another aspect of the present invention is to provide a low cost semiconductor light-emitting device that utilizes low cost materials with high reflectivity as the reflective layer, and thereby effectively saves manufacturing costs.

Yet another aspect of the present invention is to provide a semiconductor light-emitting device with effective use of its light-emitting area by designing the layout of the ohmic contacts to uniformly distribute the current passing through the light-emitting structure, and thereby improving the reliability and light-emitting area of the semiconductor light-emitting device.

A semiconductor light-emitting device according to one aspect of the present invention comprises an N-type semiconductor layer, an active layer formed on the surface of the N-type semiconductor layer, a P-type semiconductor layer formed on the surface of the active layer, and a reflective layer formed on the surface of the P-type semiconductor layer. There is a plurality of ohmic contact blocks with electrical properties of ohmic contact on the surface of the reflective layer adjacent to the P-type semiconductor layer, and the remaining part of the surface is the reflective region with higher reflectivity, and the reflective region can effectively reflect the light generated from the active layer.

The materials with the characteristic of Schottky contact or the dielectric materials of insulated-metal semiconductors can be used to cover the regions between the reflective layer and P-type semiconductor layer and outside the ohmic contact blocks.

The ohmic contact blocks are formed with conductive materials made of Ni/Au, Ni, Au, Rh, Pd, Pt, ITO, or IZO, and the reflective layer is made of Ag or Al.

The semiconductor light-emitting device further comprises a substrate provided on the surface of the N-type semiconductor layer, and an N-type electrode provided on the surface of the N-type semiconductor layer.

The plurality of ohmic contact blocks is non-uniformly distributed on the surface of the P-type semiconductor layer.

The area density of the plurality of ohmic contact blocks distributed on the surface of the P-type semiconductor layer is either linearly or non-linearly inversely proportional to the distance to the N-type electrode.

A semiconductor light-emitting device according to another aspect of the present invention comprises an N-type semiconductor layer, an active layer formed on the surface of the N-type semiconductor layer, a P-type semiconductor layer formed on the surface of the active layer, a transparent conductive layer formed on the surface of the P-type semiconductor layer, and a reflective layer formed on the surface of the transparent conductive layer. There is a plurality of ohmic contact blocks with electrical properties of ohmic contact on the surface of the reflective layer adjacent to the P-type semiconductor layer, and the remaining part of the surface is the reflective region with higher reflectivity, and the reflective region can effectively reflect the light generated from the active layer.

The materials with the characteristic of Schottky contact or the dielectric materials of insulated-metal semiconductors can be used to cover the regions between the reflective layer and P-type semiconductor layer and outside the ohmic contact blocks.

The ohmic contact blocks are formed with conductive materials made of Ni/Au, Ni, Au, Rh, Pd, Pt, ITO, or IZO, and the reflective layer is made of Ag or Al.

The semiconductor light-emitting device further comprises a substrate provided on the surface of the N-type semiconductor layer, and an N-type electrode provided on the surface of the N-type semiconductor layer.

The plurality of ohmic contact blocks is non-uniformly distributed on the surface of the transparent conductive layer.

The area density of the plurality of ohmic contact blocks distributed on the surface of the transparent conductive layer is either linearly or non-linearly inversely proportional to the distance to the N-type electrode.

The transparent conductive layer is made of materials of indium tin oxide (ITO), tin oxide (TO), indium zinc oxide (IZO), zinc oxide (ZnO), or copper oxide (CuO).

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 1:
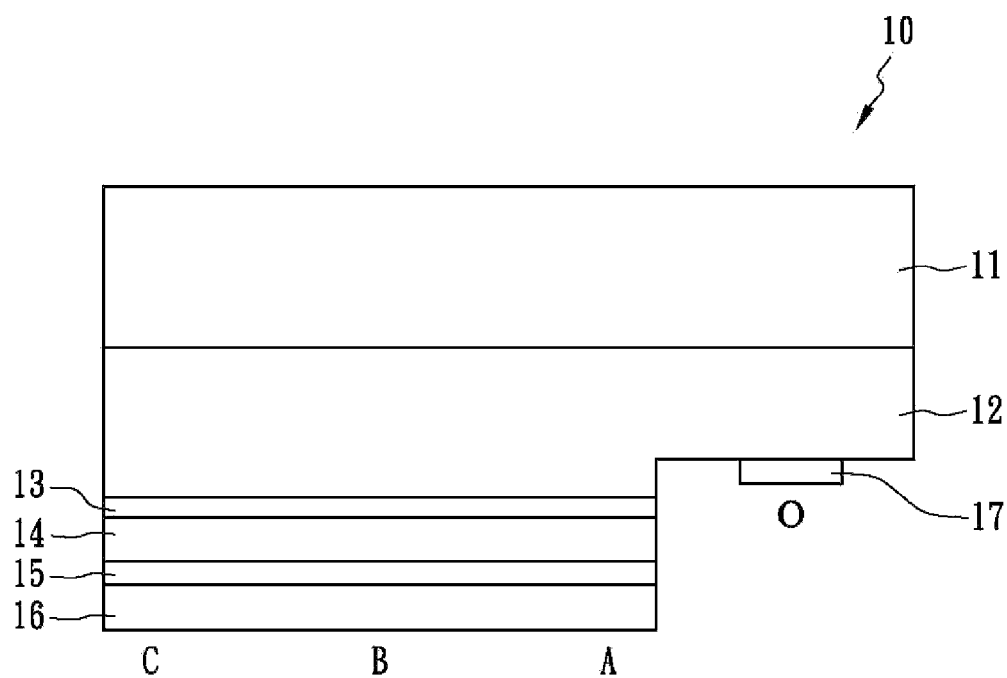
FIG. 1 is the cross-sectional diagram of a conventional light-emitting diode with a GaN semiconductor layer.
Figure 2:
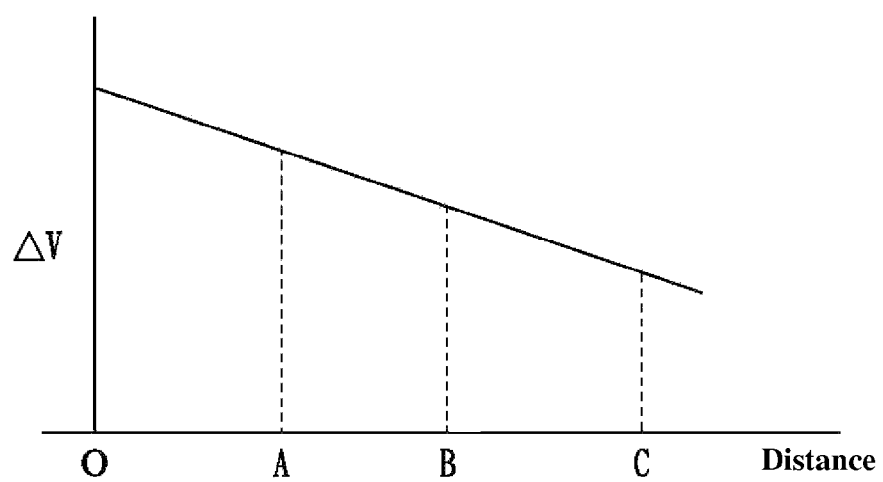
FIG. 2 is the potential gradient profile for the light-emitting structure in the light-emitting diode in FIG. 1.
Figure 3:
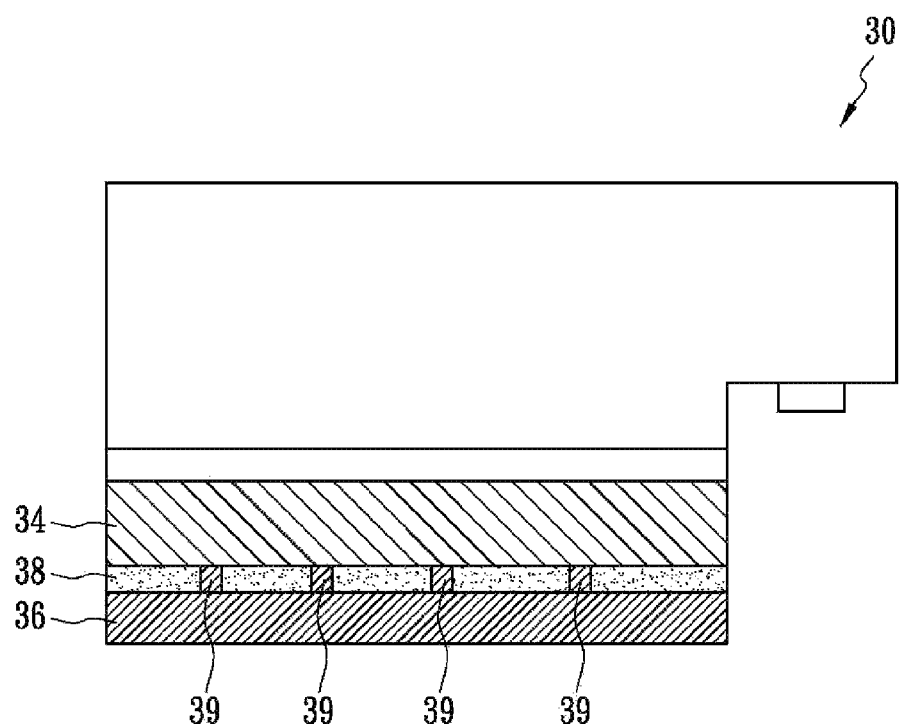
FIG. 3 is the cross-sectional diagram of another conventional light-emitting diode with a GaN semiconductor layer.
Figure 4:
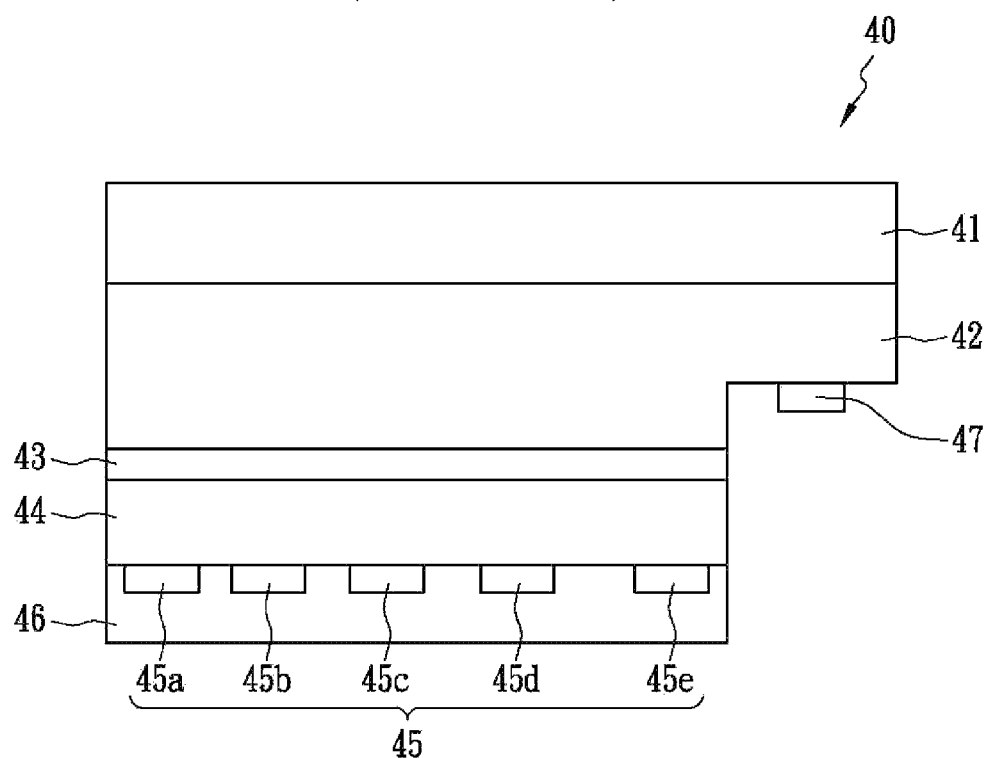
FIG. 4 is the cross-sectional diagram of a semiconductor light-emitting device of the present invention.

FIG. 4 is the cross-sectional diagram of the semiconductor light-emitting device of the present invention. An N-type semiconductor layer 42, an active layer 43, a P-type semiconductor layer 44, an ohmic contact layer 45, and a reflective layer 46 are sequentially formed on the sapphire substrate 41, and an N-type electrode 47 is formed on the exposed N-type semiconductor layer 42. The intervals between each ohmic contact block in blocks 45a to 45e on the ohmic contact layer 45 increase accordingly. By controlling the intervals between the ohmic contact blocks 45a to 45e and the distances of those blocks to the N-type electrode 47, one can compensate for the non-uniform potential distribution in the light-emitting structure caused by accumulated resistance in the N-type semiconductor layer 42, and subsequently create uniform current distribution in the light-emitting structure. The ohmic contact block 45 is formed through deposition of Ni/Au, Ni, Au, Rh, Pb, Pt, ITO, or IZO, and the reflective layer 46 can be chosen from metals with lower cost and better reflectivity, for example, Ag or Al, which can effectively reflect blue light, violet light, and ultraviolet light with shorter wavelengths.

Figure 5:
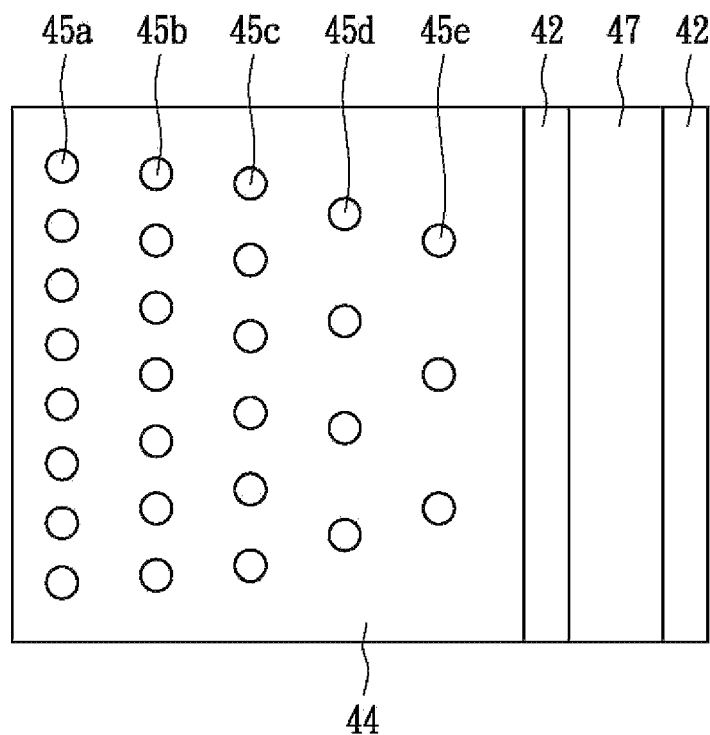
FIG. 5 is the bottom view of the semiconductor light-emitting device in FIG. 4 without the reflective layer.
Figure 6:
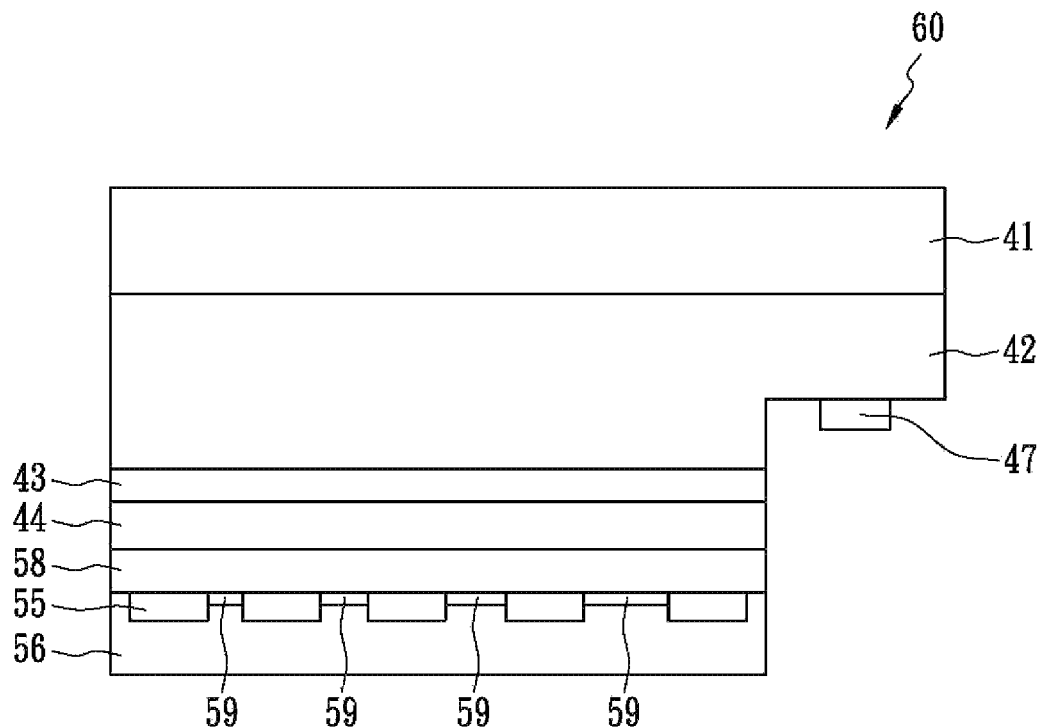
FIG. 6 is the cross-sectional diagram of the semiconductor light-emitting device of another embodiment of the present invention.

FIG. 5 is the bottom view of the semiconductor light-emitting device in FIG. 4 without the reflective layer. Not only do the intervals between two adjacent contact blocks in blocks 45a to 45e on the ohmic contact layer 45 increase accordingly, but also, the intervals between two adjacent ohmic contact blocks of each column in the ohmic contact blocks 45a to 45e are variable, wherein the interval is either linearly or non-linearly inversely proportional to the distance of those blocks to the N-type electrode 47. Since most of the current passes through the ohmic contact blocks into the light-emitting structure, this distribution design of ohmic contact blocks enables the current passing through the light-emitting structure of the semiconductor light-emitting device to distribute more uniformly, so as to use even more area of the semiconductor light-emitting device to generate more light. In comparison with FIG. 4, an additional transparent conductive layer 58 is provided between the P-type semiconductor layer 44 and the reflective layer 56 in the semiconductor light-emitting device 60, as shown in FIG. 6. The transparent conductive layer 58 is made of materials of ITO, TO, IZO, ZnO, or CuO. The ohmic contact layer 55 is disposed between the transparent conductive layer 58 and the reflective layer 56, and covers a part of the area to generate a plurality of areas with good ohmic contact for the current to flow into the light-emitting structure. Furthermore, the materials with Schottky contact characteristics or the dielectric material 59 of the insulated-metal semiconductor, for example, metal oxides, semiconductor oxides, plasma-processed semiconductor materials, or metal nitrides, can be used to cover the regions between the reflective layer 56 and the transparent conductive layer 58 and outside the ohmic contact blocks. As the dielectric material 59 is inserted between the reflective layer 56 and transparent conductive layer 58, a good capacitive effect occurs in the region with the dielectric material 59 inserted. Similarly, dielectric layers can be formed in the regions between each ohmic contact block 45a to 45e in FIG. 4, wherein the parts covered by the dielectric layers also have good capacitive effects.

For heteroepitaxial devices, such as epitaxial devices growing the III nitride semiconductor on the sapphire substrate, dislocation defect is an inevitable phenomenon that is difficult to reduce. If the location of the threading dislocation is covered by the dielectric material 59, a good capacitance circuit can avoid leakage current from directly passing the threading dislocation and burning the chip, and it can also greatly improve the protection capability against electrostatic discharge (ESD), and subsequently increase the lifetime of the semiconductor light-emitting device 60.

The present invention can also be applied to semiconductor light-emitting devices in wafer bonding, metal bonding, chip on metal (COM), and thin-film LED (or thin GaN LED) except for the semiconductor light-emitting device for the flip-chip package disclosed in FIG. 4 and FIG. 6. These structures have significant advantages in electrical and heat dissipation properties over general semiconductor light-emitting devices emitting light from the end surface of the P-type electrodes.

Figure 7:
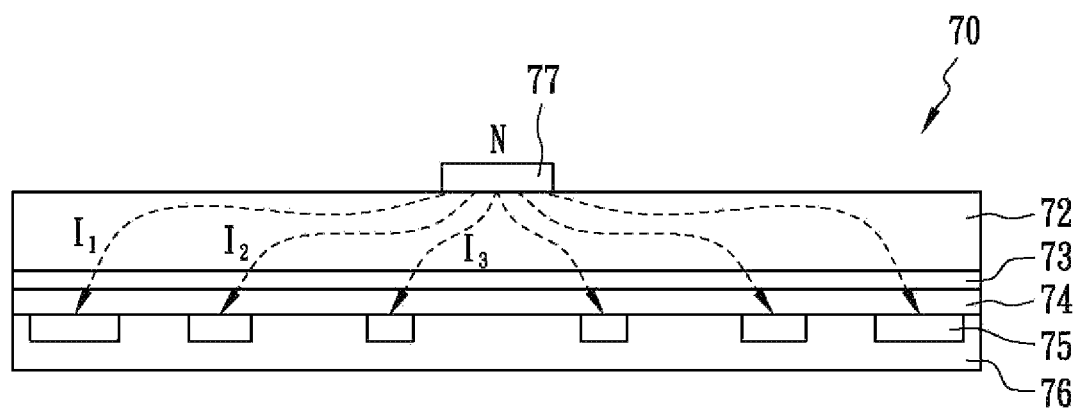
FIG. 7 is the cross-sectional diagram of the semiconductor light-emitting device of another embodiment of the present invention.

FIG. 7 is the cross-sectional diagram of the semiconductor light-emitting device of another embodiment of the present invention. Compared with FIG. 4, the semiconductor light-emitting device 70 in FIG. 7 does not comprise the substrate, where an N-type semiconductor layer 72, an active layer 73, a P-type semiconductor layer 74, an ohmic contact layer 75, and a reflective layer 76 are sequentially formed, and then the substrate is stripped from the light-emitting structure with a laser or a particular process. Finally, an N-type electrode 77 is formed on the surface of the N-type semiconductor layer 72 during the last step. Therefore, the semiconductor light-emitting device 70 can be even thinner, which also solves the problem that a portion of the light would be absorbed by the transparent substrate. Furthermore, this type of semiconductor light-emitting device 70 can be packaged by a wire bonding process in place of a flip-chip process.

The intervals and areas between ohmic contact blocks in the ohmic contact layer 75 are used to compensate for the non-uniform potential distribution in the light-emitting structure due to the accumulated resistance of the N-type semiconductor layer 72, so that the current flowing through the light-emitting structure can be uniformly distributed. That is, the current $I_1$, $I_2$, and $I_3$ will tend to be the same as the current layout of the ohmic contact blocks.

Figure 8:
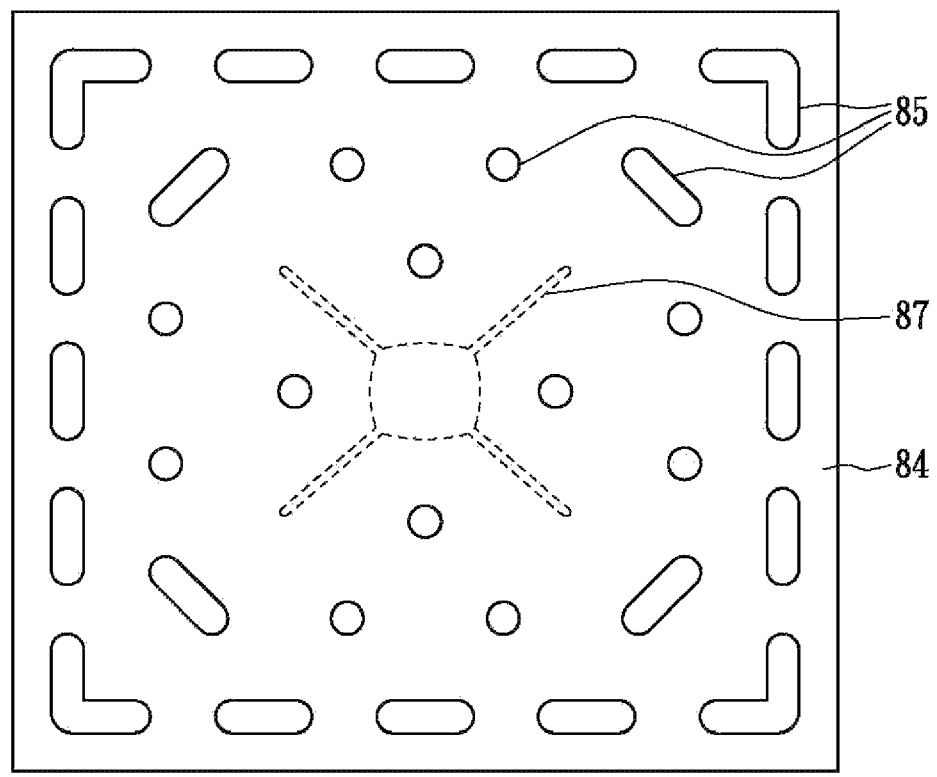
FIG. 8 is the bottom view of the semiconductor light-emitting device of another embodiment of the present invention without the reflective layer.

In order to achieve the same purpose for uniform current distribution, FIG. 8 is the bottom view of the semiconductor light-emitting device of another embodiment of the present invention without the reflective layer. The ohmic contact blocks disposed in the ohmic contact layer 85 on the surface of the P-type semiconductor layer 84 can be designed in different shapes, and the area size and the distribution density in unit area can be modified according to the distance of those blocks to the N-type electrode 87. To have a more uniform distribution of currents, the N-type electrode 87 can be designed in the radial pattern as indicated in FIG. 8.

Figure 9:
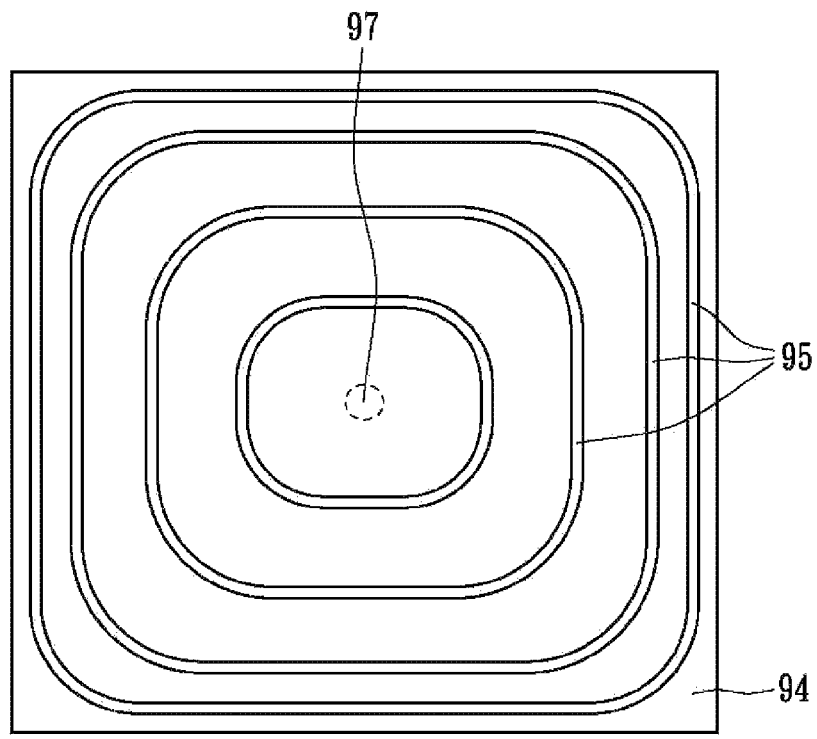
FIG. 9 is the bottom view of the semiconductor light-emitting device of another embodiment of the present invention without the reflective layer.

FIG. 9 is the bottom view of the semiconductor light-emitting device of another embodiment of the present invention without the reflective layer. A plurality of ohmic contact blocks disposed in the ohmic contact layer 95 on the surface of the P-type semiconductor layer 94 is presented in a ring-shaped concentric pattern, and the intervals between outer rings are narrower than those between the central ones. In other words, the average ohmic contacts area in a unit area is either linearly or non-linearly inversely proportional to the distance of the ohmic contact blocks to the N-type electrode 97.

Figure 10:
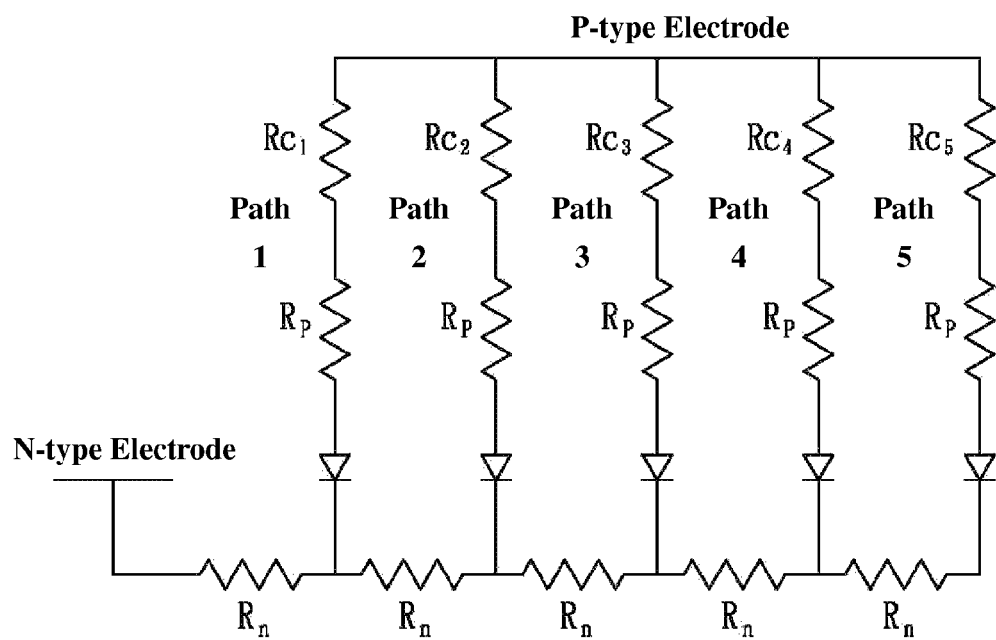
FIG. 10 is the equivalent circuit of the light-emitting structure in the semiconductor light-emitting device of the present invention.

FIG. 10 is the equivalent circuit of the light-emitting structure of the semiconductor light-emitting device of the present invention. The contact resistance $Rc_1$, $Rc_2$, $Rc_3$, $Rc_4$, and $Rc_5$ in the circuit correspond to the ohmic contact blocks 45a, 45b, 45c, 45d, and 45e respectively, wherein the contact resistance is inversely proportional to the area of the ohmic contacts. In addition, Rp is the individual resistance for the P-type semiconductor layer along the current path 1, 2, 3, 4, and 5, and Rn is the individual resistance for the N-type semiconductor layer along each path section; therefore, the circuit resistance $R_i$ along the $i^{th}$ current path can be expressed by the equation as follows:

$$R_i = Rc_i + R_p + i \cdot R_n \text{ wherein } i=1\text{-}5$$

The present invention achieves compensation for the contact resistance on the far side of the N-type electrode by controlling the average ohmic contact area in a unit area, so as to make the circuit resistance $R_i$ of each electrical path uniform.

The above-described embodiments of the present invention are intended to be illustrative only. Those skilled in the art may devise numerous alternative embodiments without departing from the scope of the following claims.

What is claimed is:

1. A semiconductor light-emitting device, comprising:
   an N-type semiconductor layer;
   a P-type semiconductor layer;
   an active layer sandwiched between the N-type semiconductor layer and the P-type semiconductor layer, able to generate light;
   a reflective layer formed on the P-type semiconductor layer; and
   a plurality of ohmic contact blocks disposed between the P-type semiconductor layer and the reflective layer,
   wherein the plurality of ohmic contact blocks is non-uniformly distributed on the P-type semiconductor layer.

2. The semiconductor light-emitting device as claimed in claim 1, wherein the material of the ohmic contact blocks is a conductive material, the material of the conductive material is Ni/Au, Ni, Au, Rh, Pd, Pt, ITO, or IZO.

3. The semiconductor light-emitting device as claimed in claim 1, wherein the material of the reflective layer includes Ag or Al.

4. The semiconductor light-emitting device as claimed in claim 1, wherein a dielectric material is formed on regions outside the ohmic contact blocks and between the reflective layer and the P-type semiconductor layer.

5. The semiconductor light-emitting device as claimed in claim 4, wherein the dielectric material is metal oxide, semiconductor oxide, plasma-processed semiconductor material or metal nitride.

6. The semiconductor light-emitting device as claimed in claim 4, wherein the dielectric material exhibits the characteristic of Schottky contact.

7. The semiconductor light-emitting device as claimed in claim 1, further comprising a substrate disposed on the N-type semiconductor layer.

8. The semiconductor light-emitting device as claimed in claim 1, further comprising an N-type electrode disposed on the N-type semiconductor layer.

9. The semiconductor light-emitting device as claimed in claim 1, further comprising a transparent conductive layer formed between the P-type semiconductor layer and the reflective layer, wherein the material of the transparent conductive layer is ITO, TO, IZO, ZnO, or CuO.

10. A semiconductor light-emitting device, comprising:
an N-type semiconductor layer;
a P-type semiconductor layer;
an active layer sandwiched between the N-type semiconductor layer and the P-type semiconductor layer, and able to generate light;
an N-type electrode disposed on the N-type semiconductor layer;
a reflective layer formed on the P-type semiconductor layer; and
a plurality of ohmic contacts disposed between the P-type semiconductor layer and the reflective layer,
wherein the area density of the plurality of ohmic contact blocks distributed on the surface of the P-type semiconductor layer is either linearly or non-linearly inversely proportional to the distance to the N-type electrode.

11. The semiconductor light-emitting device as claimed in claim 10, wherein the material of the ohmic contact blocks is a conductive material, the conductive material is Ni/Au, Ni, Au, Rh, Pd, Pt, ITO, or IZO.

12. The semiconductor light-emitting device as claimed in claim 10, wherein the material of the reflective layer is Ag or Al.

13. The semiconductor light-emitting device as claimed in claim 10, wherein a dielectric material is formed on regions outside the ohmic contact blocks and between the reflective layer and the P-type semiconductor layer.

14. The semiconductor light-emitting device as claimed in claim 13, wherein the material of the dielectric material is metal oxide, semiconductor oxide, plasma-processed semiconductor material or metal nitride.

15. The semiconductor light-emitting device as claimed in claim 13, wherein the dielectric material exhibits the characteristic of Schottky contact.

16. The semiconductor light-emitting device as claimed in claim 10, further comprising a substrate disposed on the N-type semiconductor layer.

17. The semiconductor light-emitting device as claimed in claim 10, further comprising a transparent conductive layer formed between the P-type semiconductor layer and the reflective layer, wherein the material of the transparent conductive layer is ITO, TO, IZO, ZnO, or CuO.

18. A semiconductor light-emitting device, comprising:
an N-type semiconductor layer disposed on the substrate;
an N-type electrode directly disposed on the N-type semiconductor layer;
a P-type semiconductor layer;
an active layer sandwiched between the N-type semiconductor layer and the P-type semiconductor layer, able to generate light;
a reflective layer formed on the P-type semiconductor layer; and
a plurality of ohmic contact blocks disposed between the P-type semiconductor layer and the reflective layer.

19. A semiconductor light-emitting device, comprising:
an N-type semiconductor layer;
a P-type semiconductor layer;
an active layer sandwiched between the N-type semiconductor layer and the P-type semiconductor layer, able to generate light;
a reflective layer formed on the P-type semiconductor layer; and
a plurality of ohmic contact blocks disposed between the P-type semiconductor layer and the reflective layer, wherein the plurality of ohmic contact blocks is a ring-shaped concentric pattern, and the intervals between outer rings are narrower than the intervals between the central rings.

* * * * *